US012660432B2

(12) United States Patent
Dou et al.

(10) Patent No.:  US 12,660,432 B2
(45) Date of Patent:      Jun. 16, 2026

(54) ARRAY SUBSTRATE AND DISPLAY PANEL

(71) Applicant: KunShan Go-Visionox Opto-Electronics Co., Ltd, Kunshan (CN)

(72) Inventors: Xiaoyu Dou, Kunshan (CN); Tian Ma, Kunshan (CN); Zhe Li, Kunshan (CN); Shizhen Feng, Kunshan (CN); Mingxing Liu, Kunshan (CN); Yantao Guan, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 692 days.

(21) Appl. No.: 18/146,547

(22) Filed: Dec. 27, 2022

(65) Prior Publication Data

US 2023/0125368 A1      Apr. 27, 2023

Related U.S. Application Data

(63) Continuation of application No. PCT/CN2021/106099, filed on Jul. 13, 2021.

(30) Foreign Application Priority Data

Oct. 28, 2020    (CN) .......................... 202011170520.9

(51) Int. Cl.
*H10K 59/126*          (2023.01)
*H10K 59/50*          (2023.01)

(52) U.S. Cl.
CPC ........... *H10K 59/126* (2023.02); *H10K 59/50* (2023.02)

(58) Field of Classification Search
CPC ..... H10H 29/842–8421; H10K 59/126; H10K 59/50
See application file for complete search history.

(56) References Cited

U.S. PATENT DOCUMENTS

2007/0024187 A1*    2/2007   Shin ................... H10K 59/8791
313/504
2019/0229280 A1*    7/2019   Yuan .................... H10K 77/111

FOREIGN PATENT DOCUMENTS

CN          105353533 A       2/2016
CN          107305903 A      10/2017
(Continued)

OTHER PUBLICATIONS

International Search Report issued on Oct. 12, 2021, in corresponding International Patent Application No. PCT/CN2021/106099, 5 pages.

(Continued)

*Primary Examiner* — Daniel P Shook
(74) *Attorney, Agent, or Firm* — Maier & Maier, PLLC

(57)          ABSTRACT

An array substrate and a display panel. The array substrate includes: a base layer including at least one base sub-layer each being a light-transmitting layer; a transistor layer on the base layer, the transistor layer including a plurality of transistors; and at least one light adjustment layer on a side of the transistor layer facing the base layer, the at least one light adjustment layer being configured to block, at least in a preset state, light from at least one side of the at least one light adjustment layer. In the array substrate, the amount of light irradiated on the transistor layer from the side of the base layer is reduced and the photo-induced leakage current in the transistors in the transistor layer is reduced, thus alleviating locally non-uniform brightness of a displayed image.

19 Claims, 4 Drawing Sheets

(56)　　　　　　References Cited

FOREIGN PATENT DOCUMENTS

| | | | |
|---|---|---|---|
| CN | 107425041 | B | 12/2017 |
| CN | 107845738 | A | 3/2018 |
| CN | 109300942 | A | 2/2019 |
| CN | 111402739 | A | 7/2020 |
| CN | 111463247 | A | 7/2020 |
| CN | 211125655 | U | 7/2020 |
| CN | 111652116 | A | 9/2020 |
| CN | 112289809 | A | 1/2021 |
| KR | 20150054384 | A | 5/2015 |

OTHER PUBLICATIONS

Office Action, with accompanying Machine Language Translation, issued on Jun. 9, 2022, in corresponding Chinese Application No. 202011170520.9, 12 pages.
Office Action, with accompanying Machine Language Translation, issued on Nov. 29, 2022 in corresponding Chinese Application No. 202011170520.9, 5 pages.

* cited by examiner

ARRAY SUBSTRATE AND DISPLAY PANEL

CROSS-REFERENCE TO RELATED APPLICATIONS

This application is a continuation of International Application No. PCT/CN2021/106099, filed on Jul. 13, 2021, which claims priority to Chinese Patent Application No. 202011170520.9, filed on Oct. 28, 2020, both of which are hereby incorporated by reference in their entireties.

TECHNICAL FIELD

The present application relates to the field of display, and in particular to an array substrate and a display panel.

BACKGROUND

The active matrix (AM) driving technology is a display driving technology which uses an array of thin film transistors (TFTs) to control each pixel to emit light. In a display panel driven through the AM manner, each pixel operates individually and is driven continuously. The AM driving technology has the advantages of low driving voltage, low power consumption, long life expectancy and so on.

However, with the current application of technologies such as transparent display, under-screen fingerprint sensing, under-screen cameras, etc., light transmittances of display panels continuously increase, so that TFTs are influenced by outside environment and light emission of the display panels. When the light is irradiated on the TFTs, a photo-induced leakage current is generated inside the TFTs, which causes locally non-uniform brightness the display panel and affects a display effect. Long-time light irradiation will change the characteristics of the TFTs, irreversibly affect the display quality and affect the life expectancy of the screen.

SUMMARY

The present application provides an array substrate and a display panel, which can alleviate the problem of locally non-uniform brightness.

In a first aspect, the present application provides an array substrate including: a base layer including at least one base sub-layer, each of the at least one base sub-layer being a light-transmitting layer; a transistor layer, located on the base layer, the transistor layer including a plurality of transistors; and at least one light adjustment layer, located on a side of the transistor layer facing the base layer, the at least one light adjustment layer being configured to block, at least in a preset state, light from at least one side of the at least one light adjustment layer.

In a second aspect, an embodiment of the present application provides a display panel including the array substrate according to the first aspect of the present application.

In the display substrate according to the second aspect of the present application, a display area of the display panel includes a photosensitive module reused area, and the display panel further includes: a support film, located on a side of the base layer facing away from the transistor layer; and an adhesive tape layer, located on a side of the support film facing away from the transistor layer, wherein the adhesive tape layer includes an opening disposed in the photosensitive module reused area.

In the array substrate provided by the present application, each base sub-layer is a light-transmitting layer. External light irradiates the base layer from a side of the transistor layer facing away from the base layer. After being reflected by the transistor layer, the light irradiates the transistor layer. The array substrate provided by the present application includes at least one light adjustment layer on the side of the transistor layer facing the base layer. The at least one light adjustment layer can block, at least in a preset state, the light from at least one side of the at least one light adjustment layer, which reduces the amount of light irradiated on the transistor layer from the base layer side and reduces the photo-induced leakage current in the transistors in the transistor layer, thereby alleviating locally non-uniform brightness of a displayed image.

Optionally, the light adjustment layer is a photochromic layer which is configured to block light from any side of the photochromic layer when in a color-changed state. When the photochromic layer is in the color-changed state, the light from both sides thereof is blocked, thereby further reducing the amount of light irradiated on the transistor layer from the base layer side and ensuring the operation stability of the transistors in the transistor layer. The light adjustment layer is often irradiated by external light, so that the light adjustment layer is often in the color-changed state, thereby preventing the transistors from being irradiated for a long time and improving the service life of the transistors and the array substrate.

Optionally, the photochromic layer is reused as the base sub-layer of the base layer, so that the originally required thickness of the array substrate is not increased, and the thinning of the array substrate is facilitated.

Optionally, the light adjustment layer is a unidirectional light-transmitting layer including a first surface facing the transistor layer and a second surface facing away from the transistor layer. The unidirectional light-transmitting layer blocks light from the second surface. When the array substrate is integrated with the photosensitive module, the photosensitive module is located on the side of the second surface of the unidirectional light-transmitting layer, and the light to be sensed by the photosensitive module comes from the side where the first surface of the unidirectional light-transmitting layer is located, so that the light can transmit through the unidirectional light-transmitting layer and reach the photosensitive module, so as to ensure the normal operation of the photosensitive module. At the same time, reflected light from the side of the second surface of the unidirectional light-transmitting layer is blocked by the unidirectional light-transmitting layer, which reduces the influence of the reflected light on the normal operation of the transistor, thereby protecting the transistors while the normal operation of the integrated photosensitive module is not affected.

DETAILED DESCRIPTION

Features and exemplary embodiments of various aspects of the present application will be described in detail below. In order to make the objects, technical solutions and advantages of the present application clearer, the present application will be further described in detail below with reference to the drawings and specific embodiments. It should be understood that, the specific embodiments described herein are only for the illustration of the present application, not for limiting the present application.

The present application provides an array substrate, which can be used in a display panel. The display panel may be a display panel such as an organic light emitting diode (OLED) display panel, a liquid crystal display panel (LCD), or a display panel using light emitting diode (LED) devices (for example, a Micro-LED display panel). The array substrate provided by the present application may be presented in various forms, and some examples of the array substrate will be described below.

Figure 1:
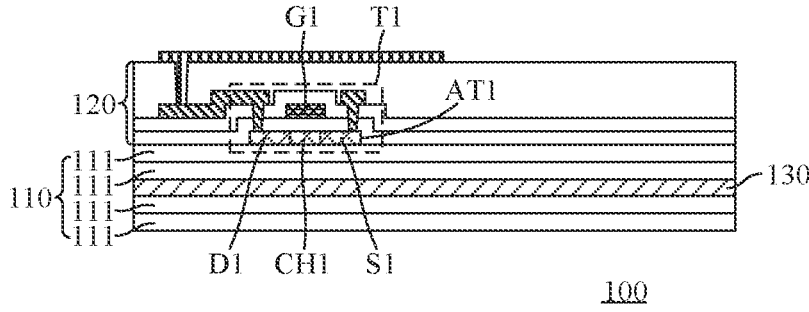
FIG. 1 is a schematic structural diagram of an array substrate according to a first embodiment of the present application.

An array substrate according to a first embodiment of the application is shown in FIG. 1. FIG. 1 shows a cross-sectional structure of an array substrate 100. The array substrate 100 includes a base layer 110, a transistor layer 120 and a light adjustment layer 130. The light adjustment layer 130 is located on a side of the transistor layer 120 facing the base layer 110. The light adjustment layer 130 is configured to block, at least in a preset state, light from at least one side of the light adjustment layer, so as to reduce amount of light irradiated on the transistor layer 120 from the side of the base layer 110, reduce the photo-induced leakage current in transistors T1 in the transistor layer 120, thereby alleviating locally non-uniform brightness of a displayed image. In this embodiment, the array substrate 100 is applied to an OLED display panel for illustration.

The base layer 110 includes at least one base sub-layer 111 each being a light-transmitting layer. In this embodiment, the base layer 110 includes four base sub-layers 111 stacked in sequence, so that the base layer 110 includes a substrate of a composite layer structure. Preferably, the base layer 110 may further include a buffer layer which may be a single-layer structure or a structure including at least two layers. The base sub-layer 111 may be an organic layer (for example, a polyimide (PI) layer), an inorganic layer (for example, a silicon oxide (SiO) layer, or a silicon nitride (SiN) layer), or a combination of the above organic layer and inorganic layer.

The transistor layer 120 is located on the base layer 110 and includes a plurality of transistors T1. The transistor T1 is a thin film transistor (TFT), which includes an active layer and a gate G1 located on the active layer AT1. The gate G1 and the active layer AT1 are insulated by a gate insulation layer. The active layer AT1 may include a source region S1 and a drain region D1 disposed opposite to each other. When an on-voltage is applied to the gate G1, an electrically conductive channel CH1 exists in the active layer AT1 between the source region S1 and the drain region D1. As mentioned above, each base sub-layer 111 is a light-transmitting layer, and the base layer 110 is irradiated by external light from the side of the transistor layer 120 facing away from the base layer 110. After being reflected in the base layer 110, the external light is likely to irradiate the transistor T1. When the channel CH1 of the transistor T1 is irradiated by light, a photo-induced leakage current is likely to be generated.

In an embodiment shown in FIG. 1, the light adjustment layer 130 is illustrated as being disposed between the four base sub-layers 111 of the base layer 110 as an example. Specifically, two of the four base sub-layers 111 are located on an upper side of the light adjustment layer 130, and the other two of the four base sub-layers 111 are located on a lower side of the light adjustment layer 130. However, the number and positions of the light adjustment layers 130 may not be limited to the above illustration. The number of the light adjustment layers 130 may also be two, three, etc. Each light adjustment layer 130 may be located between any two adjacent base sub-layers 111, or may be located on a side of the base layer 110 facing the transistor layer 120 or on a side facing away from the transistor layer 120, as long as the light adjustment layer 130 is located on the side of the transistor layer 120 facing the base layer 110.

Figure 2:
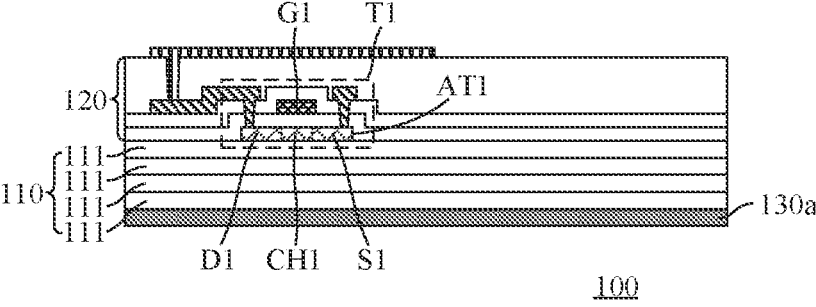
FIG. 2 is a schematic structural diagram of an array substrate according to a second embodiment of the present application.

An array substrate according to a second embodiment of the present application is shown in FIG. 2. FIG. 2 shows a cross-sectional structure of an array substrate 100. The array substrate 100 includes a base layer 110, a transistor layer 120 and a light adjustment layer 130*a*. The light adjustment layer 130*a* is configured to block, at least in a preset state, light from at least one side of the light adjustment layer. Part of the structure of the array substrate 100 according to the second embodiment is the same as the structure of the array substrate 100 according to the first embodiment. The differences between the two will be described below, and the similarities will not be described in detail again.

In this embodiment, the light adjustment layer 130*a* is a photochromic layer 130*a*. The photochromic layer 130*a* is configured to block light from any side of the photochromic layer when in a color-changed state. The photochromic layer 130*a* is located on a side of the transistor layer 120 facing the base layer 110. When the photochromic layer 130*a* is in the color-changed state, the light from both sides of the photochromic layer 130*a* is blocked, thereby further reducing an amount of light irradiated on the transistors T1 from the side of the base layer 110 and ensuring the operation stability of the transistors T1. The light adjustment layer 130*a* is often irradiated by external light, so that the light adjustment layer 130*a* is often in the color-changed state, thereby preventing the transistors T1 from being irradiated for a long time and improving the service life of the transistors T1 and the array substrate 100.

The photochromic layer 130*a* is a light-transmitting layer in an initial state, that is, the photochromic layer 130*a* is a light-transmitting layer when it is not irradiated by light. A color of the photochromic layer 130*a* gradually changes when it is irradiated by light, that is, the photochromic layer 130*a* gradually changes into the color-changed state, and blocks the light from any side of the photochromic layer. The photochromic layer 130*a* is a black layer in the color-changed state, so that it can absorb light in the color-changed state.

When the array substrate 100 is applied in a display panel or a display apparatus, it can be integrated with a photosensitive module. In this case, the photosensitive module is located on the side of the base layer 110 facing away from the transistor layer 120 and the side of photochromic layer 130a facing away from the transistor layer 120.

Figure 3:
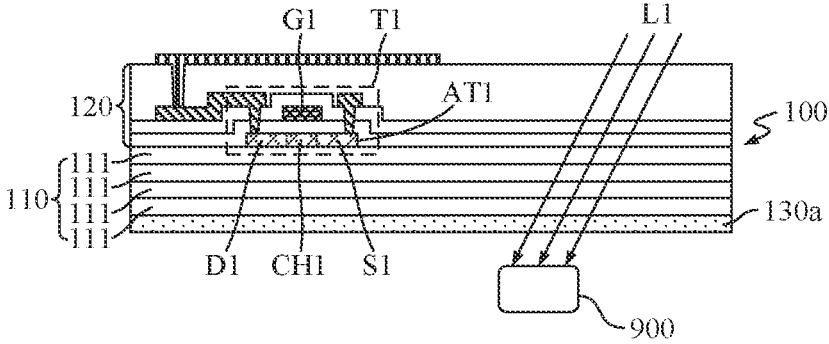
FIG. 3 is a schematic structural diagram of the array substrate shown in FIG. 2 when a photochromic layer in an initial state, after the array substrate is integrated with a photosensitive module.

Reference is made to FIG. 3. FIG. 3 is a schematic structural diagram of the array substrate 100 shown in FIG. 2 when a photochromic layer 130a in an initial state, after the array substrate 100 is integrated with a photosensitive module 900. The photochromic layer 130a gradually changes into the color-changed state when exposed to light for a long time, and the color of the photochromic layer 130a does not change immediately when it is exposed to light for a short time. When the photochromic layer 130a is in the initial state, light L1 from the side of the transistor layer 120 facing away from the base layer 110 can transmit through the photochromic layer 130a, so that the light L1 can be received by the photosensitive module 900, so as to ensure the normal operation of the photosensitive module 900. The photosensitive module 900 may be an optical fingerprint identification module. The photochromic layer 130a remains a light-transmitting layer when it is exposed to light for a short time, so as to ensure the execution of fingerprint identification.

Figure 4:
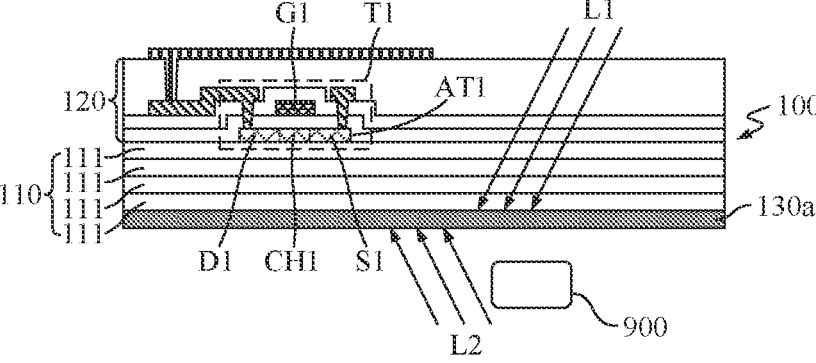
FIG. 4 is a schematic structural diagram of the array substrate shown in FIG. 2 when a photochromic layer in a color-changed state, after the array substrate is integrated with a photosensitive module.

Reference is made to FIG. 4. FIG. 4 is a schematic structural diagram of the array substrate 100 shown in FIG. 2 when a photochromic layer 130a in a color-changed state, after the array substrate 100 is integrated with a photosensitive module 900. The photochromic layer 130a transforms into the color-changed state after being exposed to light for a long time, and blocks light from any side of the photochromic layer 130a. At this time, both the light L1 from the side of the transistor layer 120 facing away from the base layer 110 and the light L2 from the side of the photochromic layer 130a facing away from the transistor layer 120 are blocked by the photochromic layer 130a, which reduces the amount of light irradiated on the transistors T1 from the side of the base layer 110 and reduces the photo-induced leakage current in the transistors T1, thereby alleviating locally non-uniform brightness of a displayed image.

Figure 5:
FIG. 5 is a schematic structural diagram of the photochromic layer in the array substrate shown in FIG. 2.

Reference is made to FIG. 5. FIG. 5 is a schematic structural diagram of the photochromic layer 130a in the array substrate 100 shown in FIG. 2. The photochromic layer 130a includes a base material layer 131a and at least one photochromic particle 131b. The base material layer 131a is a light-transmitting layer. The at least one photochromic particle 131b is dispersed in the base material layer 131a. A material of the photochromic particle 131b includes at least one of aluminoborosilicate, borosilicate and silver halide.

Figure 6:
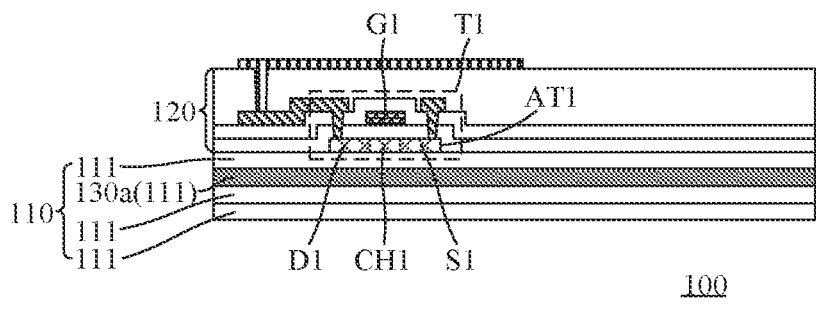
FIG. 6 is a schematic structural diagram of an array substrate according to a third embodiment of the present application.

An array substrate according to a third embodiment of the present application is shown in FIG. 6. FIG. 6 shows a cross-sectional structure of an array substrate 100. The array substrate 100 includes a base layer 110, a transistor layer 120, and a light adjustment layer 130a. The light adjustment layer 130a is a photochromic layer 130a. Part of the structure of the array substrate 100 according to the third embodiment is the same as the structure of the array substrate 100 according to the second embodiment. The differences between the two will be described below, and the similarities will not be described in detail again.

In this embodiment, the photochromic layer 130a is reused as the base sub-layer 111 of the base layer 110. For example, the photochromic layer 130a is one layer, which is reused as one layer of the base sub-layer 111. In some other embodiments, the photochromic layer 130a may be at least two layers, at least one of which may be reused as the base sub-layer 111 of the base layer 110. Since the photochromic layer 130a is reused as the base sub-layer 111 of the base layer 110, the originally required thickness of the array substrate 100 is not increased, thus facilitating the thinning of the array substrate 100.

The photochromic layer 130a may be formed by adding at least one photochromic particle to any at least one base sub-layer 111, so that the formation process of the photochromic layer 130a is simpler and the fabrication efficiency of the array substrate 100 is improved. The material of the photochromic particle includes at least one of aluminoborosilicate, borosilicate and silver halide.

Figure 7:
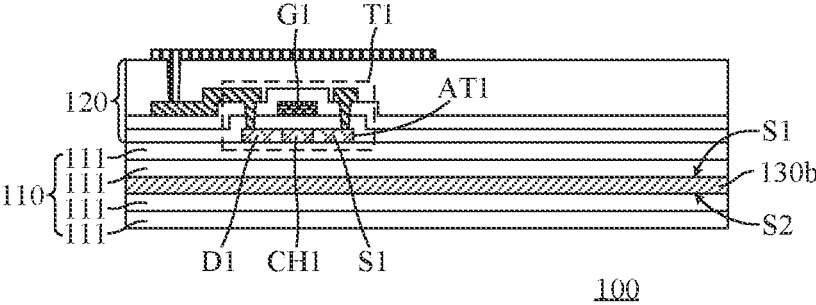
FIG. 7 is a schematic structural diagram of an array substrate according to a fourth embodiment of the present application.

An array substrate according to a fourth embodiment of the present application is shown in FIG. 7. FIG. 7 shows a cross-sectional structure of an array substrate 100. The array substrate 100 includes a base layer 110, a transistor layer 120, and a light adjustment layer 130b. The light adjustment layer 130b is configured to block light from at least one side of the light adjustment layer at least in a preset state. Part of the structure of the array substrate 100 according to the fourth embodiment is the same as the structure of the array substrate 100 according to the first embodiment. The differences between the two will be described below, and the similarities will not be described in detail again.

In this embodiment, the light adjustment layer 130b is a unidirectional light-transmitting layer 130b including a first surface S1 facing the transistor layer 120 and a second surface S2 facing away from the transistor layer 120. The unidirectional light-transmitting layer 130b allows light from the first surface S1 to transmit through, and blocks light from a side, which is corresponding to the second surface S2, of the unidirectional light-transmitting layer.

The unidirectional light-transmitting layer 130b includes a plurality of sub-layers that are stacked. Each of the plurality of sub-layers is a light-transmitting layer with a preset refractive index, and a plurality of refractive indexes, of the plurality of sub-layers sequentially stacked in a direction from the first surface S1 to the second surface S2, decrease along the direction from the first surface to the second surface. The unidirectional light-transmitting layer 130b with refractive index gradient can ensure that the light from the first surface S1 can transmit through the unidirectional light-transmitting layer 130b. When the light from the second surface S2 passes through the unidirectional light-transmitting layer 130b, an incident angle of the light incident on the second surface S2 tends to be a non-vertical angle, and each time the light passes through a sub-layer, the light enters from an optically dense medium to an optically sparse medium, thus resulting in more reflections, making it difficult for the light from the second surface S2 to transmit through the unidirectional light-transmitting layer 130b.

In this embodiment, the unidirectional light-transmitting layer 130b is not limited to a film layer that allows light from one side to transmit through and completely block light from the other side. The unidirectional light-transmitting layer 130b may be, for example, a film layer as mentioned in the above example that blocks light from one side by arranging its transmittance for the light from the side to be significantly lower than its transmittance for the light from the other side. A first transmittance, for light from one side of the unidirectional light-transmitting layer, of the unidirectional light-transmitting layer is lower than a second transmittance, for light from the other side of the unidirectional light-transmitting layer, of the unidirectional light-transmitting layer.

When the array substrate 100 is applied to a display panel or a display apparatus, it can be integrated with a photosensitive module to realize a photosensitive function. For example, the photosensitive module is an optical fingerprint identification module for realizing fingerprint identification.

Figure 8:
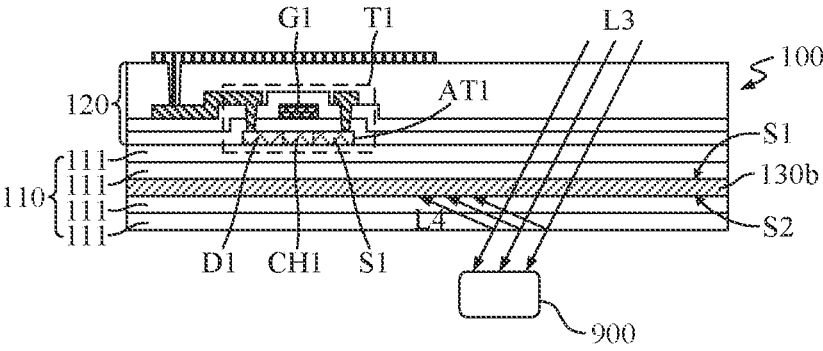
FIG. 8 is a schematic structural diagram of the array substrate shown in FIG. 7 after being integrated with a photosensitive module.

FIG. 8 is a schematic structural diagram of the array substrate 100 shown in FIG. 7 after being integrated with the photosensitive module 900. When the array substrate 100 is integrated with the photosensitive module 900, the photosensitive module 900 is located on the side of the second surface S2 of the unidirectional light-transmitting layer 130b. Light L3 from the side of the unidirectional light-transmitting layer 130b where the first surface S1 is located is the light to be sensed by the photosensitive module 900, such as light carrying fingerprint information. The light L3 can transmit through the unidirectional light-transmitting layer 130b to reach the photosensitive module 900, so as to ensure the normal operation of the photosensitive module 900. At the same time, reflected light L4 from the side of the second surface S2 of the unidirectional light-transmitting layer 130b is blocked by the unidirectional light-transmitting layer 130b, which reduces the influence of the reflected light L4 on the normal operation of the transistors T1, so as to protect the transistors T1 without affecting normal operation of the integrated photosensitive module 900.

The present application further provides a display panel including the array substrate 100 according to any of the foregoing embodiments of the present application.

Figure 9:
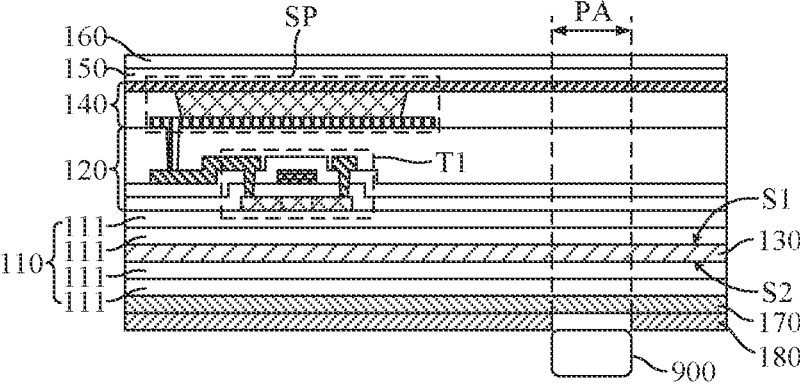
FIG. 9 is a schematic structural diagram of a display panel according to the present application.

A display panel according to one of the embodiments provided by the present application is shown in FIG. 9. The display panel includes an array substrate 100 including a base layer 110, a transistor layer 120 and a light adjustment layer 130.

The base layer 110 includes at least one base sub-layer 111 each being a light-transmitting layer. The transistor layer 120 is located on the base layer 110 and includes a plurality of transistors T1. The light adjustment layer 130 is located on a side of the transistor layer 120 facing the base layer 110. The light adjustment layer 130 is configured to block light from at least one side of the light adjustment layer at least in a preset state.

This application takes the display panel being an OLED display panel as an example for illustration. The display panel further includes a light-emitting element layer 140 including a plurality of light-emitting elements SP. The light-emitting elements SP in this application are OLEDs. The display panel further includes an encapsulation layer 150 and a cover plate 160. The encapsulation layer 150 is located on a side of the light-emitting element layer 140 facing away from the base layer 110. The cover plate 160 is located on a side of the encapsulation layer 150 facing away from the light-emitting element layer 140.

A display area of the display panel includes a photosensitive module reused area PA, and the display panel further includes a support film 170 and an adhesive tape layer 180. The support film 170 is located on a side of the base layer 110 facing away from the transistor layer 120. The adhesive tape layer 180 is located on a side of the support film 170 facing away from the transistor layer 120, wherein the adhesive tape layer 180 includes an opening disposed in the photosensitive module reused area PA.

The light adjustment layer 130 includes a first surface S1 facing the transistor layer 120 and a second surface S2 facing away from the transistor layer 120. The light adjustment layer 130 blocks light at least from the second surface S2 at least in a first state, so that amount of light irradiated on the transistors T1 is reduced at least in the first state, and operation stability of the transistors T1 is ensured. The light adjustment layer 130 allows the light from the first surface S1 to transmit through at least in a second state, so that the photosensitive module 900 can receive light from the light adjustment layer 130 facing the side of the light-emitting element layer 140 at least in the second state, so as to realize a photosensitive function.

The light adjustment layer 130 may be a photochromic layer. The photochromic layer blocks light from any side of the photochromic layer when in a color-changed state. The photochromic layer is a light-transmitting layer in the initial state, that is, the photochromic layer is a light-transmitting layer when it is not irradiated by light. A color of the photochromic layer gradually changes when it is irradiated by light, that is, it gradually changes into a color-changed state, and blocks light from any side of the photochromic layer.

The light adjustment layer 130 may also be a unidirectional light-transmitting layer, wherein the unidirectional light-transmitting layer allows light from the first surface S1 to transmit through, and blocks light from the second surface S2.

In FIG. 9, the light adjustment layer 130 is illustrated as being disposed between the four base sub-layers 111 of the base layer 110 as an example. Specifically, two of the four base sub-layers 111 are located on an upper side of the light adjustment layer 130, and the other two of the four base sub-layers 111 are located on a lower side of the light adjustment layer 130. However, the number and positions of the light adjustment layers 130 may not be limited to the above illustration. The number of the light adjustment layers 130 may also be two, three, etc. Each light adjustment layer 130 may be located between any two adjacent base sub-layers 111, or may be located on a side of the base layer 110 facing the transistor layer 120 or on a side facing away from the transistor layer 120, as long as the light adjustment layer 130 is located on the side of the transistor layer 120 facing the base layer 110.

In this application, the photosensitive module 900 may be an optical fingerprint identification module for realizing fingerprint identification. In other embodiments, the photosensitive module 900 may be other photosensitive apparatuses, such as an image capturing apparatus, a light sensor, or the like, or may be a combination of the above photosensitive devices.

In the array substrate provided by the present application, the light adjustment layer 130 is located on the side of the transistor layer 120 facing the base layer 110. The light adjustment layer 130 can block light from at least one side of the light adjustment layer at least in a preset state, so as to reduce amount of light irradiated on the transistor layer 120 from the side of the base layer 110 and reduce the photo-induced leakage current in the transistors T1 in the transistor layer 120, thereby alleviating locally non-uniform brightness of an displayed image.

When the array substrate 100 is used in a display panel and a display apparatus, since the arrangement of the light adjustment layer 130 can reduce the amount of light irradiated on the transistor layer 120 from the side of the base layer 110. The light from the side of the base layer 110 may not be limited to the light reflected by the base sub-layer 111 in the base layer 110, or may be the light reflected by other film layers on the side of the base layer 110 or emitted by a light-emitting structure such as a backlight module.

The embodiments of the present application as described above do not exhaustively describe all the details, and the present application is not limited to the specific embodiments described above. Obviously, many modifications and variations are possible in light of the above description. These embodiments are specifically described in this specification to better explain principles and practical usage of the present application, so that those skilled in the art can make good use of the present application and make modifications based on the present application. This application is limited only by the claims, along with their full scope and equivalents.

What is claimed is:

1. A display panel, comprising an array substrate comprising:

a base layer, comprising at least one base sub-layer, each of the at least one base sub-layer being a light-transmitting layer;

a transistor layer, located on the base layer, the transistor layer comprising a plurality of transistors; and at least one light adjustment layer, located on the same side of the transistor layer as the base layer, the at least one light adjustment layer being configured to block, at least in a preset state, light from at least one side of the at least one light adjustment layer, wherein the at least one light adjustment layer is transformed gradually from a light-transmitting state to a color-changed state depending on a time period of being exposed to light, wherein a display area of the display panel comprises a photosensitive module setting area, and the display panel further comprises:

a support film, located on a side of the base layer facing away from the transistor layer; and an adhesive tape layer, located on a side of the support film facing away from the transistor layer, wherein the adhesive tape layer comprises an opening disposed in the photosensitive module setting area.

2. The display panel according to claim 1, wherein the light adjustment layer is a photochromic layer, and the photochromic layer is configured to allow light from a side of the transistor layer away from the base layer to transmit through the photochromic layer when the photochromic layer is in an initial state to enable the light to be received by a photosensitive module of the display panel to ensure normal operation of the photosensitive module.

3. The display panel according to claim 1, wherein the transistor layer comprises a plurality of transistors, and the light adjustment layer is a photochromic layer, and the photochromic layer is configured to reduce an amount of light irradiated on a channel of the transistor from the side of the base layer when the photochromic layer is in a color-changed state, wherein the light from the side of the base layer is light reflected by the at least one base sub-layer in the base layer or by other film layers on the side of the base layer.

4. The display panel according to claim 1, wherein the light adjustment layer is a photochromic layer, and the photochromic layer is configured to be in the light-transmitting state when the photochromic layer is in an initial state or exposed to light for a short time, and to be in the color-changed state by gradually changing color when the photochromic layer is exposed to light for a long time.

5. The display panel according to claim 1, wherein the at least one light adjustment layer is located on a side of the base layer facing away from the transistor layer.

6. The display panel according to claim 1, wherein the light adjustment layer is a photochromic layer, the photochromic layer is configured to block light from any side of the photochromic layer when in a color-changed state.

7. The display panel according to claim 6, wherein the photochromic layer is a black layer in the color-changed state, and the photochromic layer is a light-transmitting layer in an initial state.

8. The display panel according to claim 6, wherein the array substrate comprises one photochromic layer.

9. The display panel according to claim 6, wherein the array substrate comprises at least two photochromic layers.

10. The display panel according to claim 6, wherein the photochromic layer is formed by adding at least one photochromic particle to any of the at least one base sub-layer.

11. The display panel according to claim 10, wherein a material of the photochromic particle comprises at least one of aluminoborosilicate and borosilicate.

12. The display panel according to claim 6, wherein the photochromic layer comprises:

a base material layer, the base material layer being a light-transmitting layer; and at least one photochromic particle dispersed in the base material layer.

13. The display panel according to claim 12, wherein a material of the photochromic particle comprises at least one of aluminoborosilicate, borosilicate and silver halide.

14. The display panel according to claim 1, wherein the light adjustment layer is a unidirectional light-transmitting layer, the unidirectional light-transmitting layer comprises a first surface facing the transistor layer and a second surface facing away from the transistor layer, and the unidirectional light-transmitting layer blocks light from a side, which is corresponding to the second surface, of the unidirectional light-transmitting layer.

15. The display panel according to claim 14, wherein the unidirectional light-transmitting layer comprises a plurality of sub-layers that are stacked, each of the plurality of sub-layers is a light-transmitting layer with a preset refractive index, and a plurality of refractive indexes, of the plurality of sub-layers sequentially stacked in a direction from the first surface to the second surface, decrease along the direction from the first surface to the second surface.

16. The display panel according to claim 14, wherein the unidirectional light-transmitting layer allows light from one side of the unidirectional light-transmitting layer to transmit through, and blocks light from the other side of the unidirectional light-transmitting layer.

17. The display panel according to claim 14, wherein a first transmittance, for light from one side of the unidirectional light-transmitting layer, of the unidirectional light-transmitting layer is lower than a second transmittance, for light from the other side of the unidirectional light-transmitting layer, of the unidirectional light-transmitting layer.

18. The display panel according to claim 1, wherein each of the at least one light adjustment layer is located between any two adjacent base sub-layers.

19. The display panel according to claim 1, wherein the at least one light adjustment layer is located on a side of the base layer facing the transistor layer.

* * * * *